US012405311B2

(12) United States Patent
Marten et al.

(10) Patent No.: US 12,405,311 B2
(45) Date of Patent: Sep. 2, 2025

(54) ISOLATION MONITORING

(71) Applicant: Sensata Technologies, Inc., Attleboro, MA (US)

(72) Inventors: Victor Marten, Flushing, NY (US); Nicolas Clauvelin, New York, NY (US); Ioannis Milios, New York, NY (US)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 18/550,455

(22) PCT Filed: May 22, 2023

(86) PCT No.: PCT/IB2023/055260
§ 371 (c)(1),
(2) Date: Sep. 13, 2023

(87) PCT Pub. No.: WO2023/228057
PCT Pub. Date: Nov. 30, 2023

(65) Prior Publication Data
US 2024/0393401 A1 Nov. 28, 2024

Related U.S. Application Data

(60) Provisional application No. 63/365,251, filed on May 24, 2022.

(51) Int. Cl.
*G01R 31/3835* (2019.01)
*H01M 10/42* (2006.01)
(52) U.S. Cl.
CPC .... *G01R 31/3835* (2019.01); *H01M 10/4228* (2013.01); *H01M 10/4285* (2013.01); *H01M 2250/20* (2013.01)

(58) Field of Classification Search
CPC .......... G01R 31/3835; H01M 10/4228; H01M 10/4285; H01M 2250/20
(Continued)

(56) References Cited

U.S. PATENT DOCUMENTS 10,288,690 B2 * 5/2019 Katano ............... G01R 31/3835
10,421,367 B2 * 9/2019 Alser ................... G01R 31/006
(Continued)

FOREIGN PATENT DOCUMENTS

| CN | 109696582 A | 4/2019 |
| CN | 113567743 A | 10/2021 |

(Continued)

OTHER PUBLICATIONS

Corrected Version—Written Opinion in PCT application No. PCT/IB2023/055260, dated Sep. 4, 2023.
(Continued)

*Primary Examiner* — Huy Q Phan
*Assistant Examiner* — Trung Q Nguyen
(74) *Attorney, Agent, or Firm* — Oppedahl Patent Law Firm LLC

(57) ABSTRACT

An isolation monitoring approach according to the invention is defined with respect to first and second battery connection positions, each of which is not tied to a chassis. First and second respective resistor strings, each having a first end and a second end, are each connected at their first end to the respective first and second battery connection positions. The first and second resistor strings are each connected at their second end to the chassis. In each of the first and second resistor strings, an optically-controlled MOSFET relay is connected across part of the resistor string. Connected to each of the resistor strings, at a point between the MOSFET relay and the chassis, is a respective voltage measurement circuit connected to measure voltage relative to the chassis.

(Continued)

In operation, the MOSFETs associated with the resistor strings can be turned on and off. This brings about an excitation signal with respect to the resistor strings, and the voltage measurement circuits can measure the voltages during the time of the excitation signal, comparing them with the voltages in the absence of the excitation signal. This permits arriving at an inferred value for isolation loss along a modeled leakage path between the associated battery connection positions and the chassis. In the event of an isolation failure, the event can be annunciated.

35 Claims, 4 Drawing Sheets

(58) Field of Classification Search
USPC .................................................. 324/425–434
See application file for complete search history.

(56) References Cited

U.S. PATENT DOCUMENTS

| | | |
|---|---|---|
| 10,852,332 B2 | 12/2020 | Clauvelin |
| 11,448,706 B2 | 9/2022 | Park |
| 12,181,503 B1* | 12/2024 | Chen ...................... G01R 31/52 |
| 2016/0214484 A1* | 7/2016 | Gale ....................... G01R 31/52 |
| 2021/0102998 A1* | 4/2021 | Azidehak ............... G01R 31/52 |
| 2022/0003823 A1 | 1/2022 | Lee |
| 2022/0103197 A1* | 3/2022 | Briseno-Vidrios .... H04B 1/123 |
| 2022/0187381 A1* | 6/2022 | Kim .................... H01M 50/505 |
| 2022/0289034 A1* | 9/2022 | Bitenc ................... B60L 3/0069 |

FOREIGN PATENT DOCUMENTS

| | | |
|---|---|---|
| KR | 20000074381 A | 12/2000 |
| KR | 20190001330 A | 1/2019 |

OTHER PUBLICATIONS

International Search Report in PCT application No. PCT/IB2023/055260, dated Sep. 5, 2023.

Written Opinion in PCT application No. PCT/IB2023/055260, dated Sep. 5, 2023.

* cited by examiner

[Fig. 1]
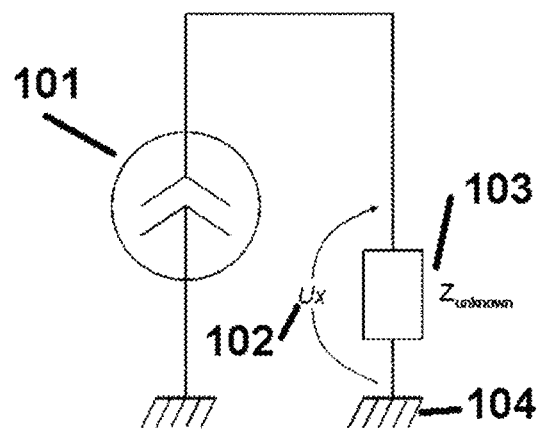
[Fig. 2]
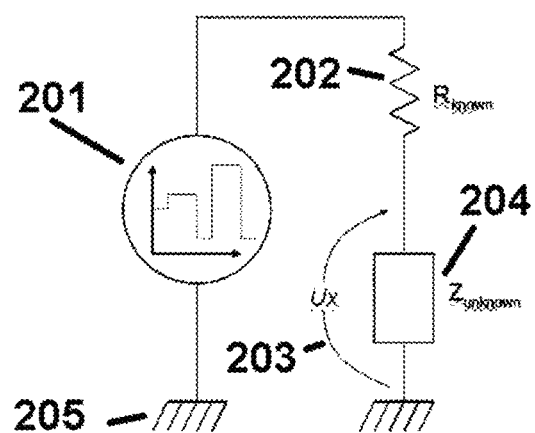

[Fig. 3]
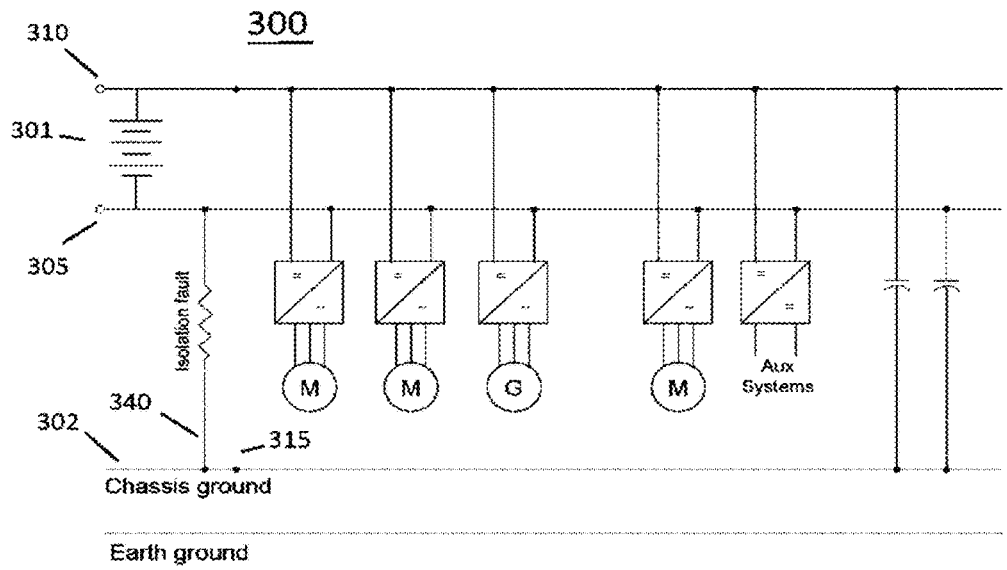
[Fig. 4]
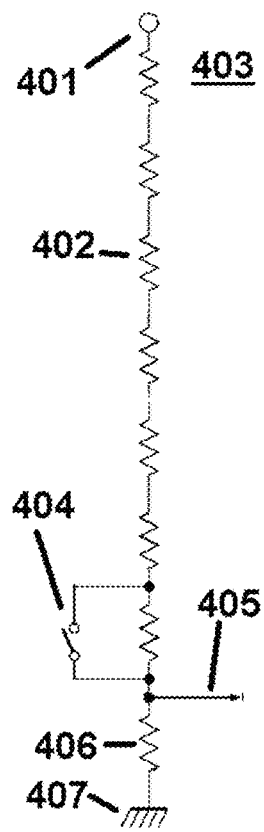

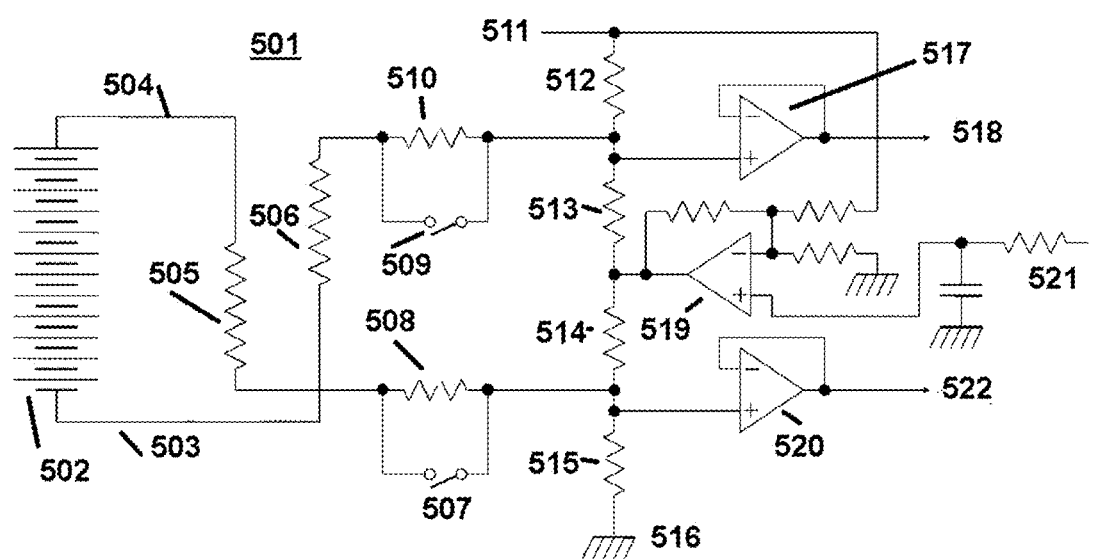
[Fig. 5]

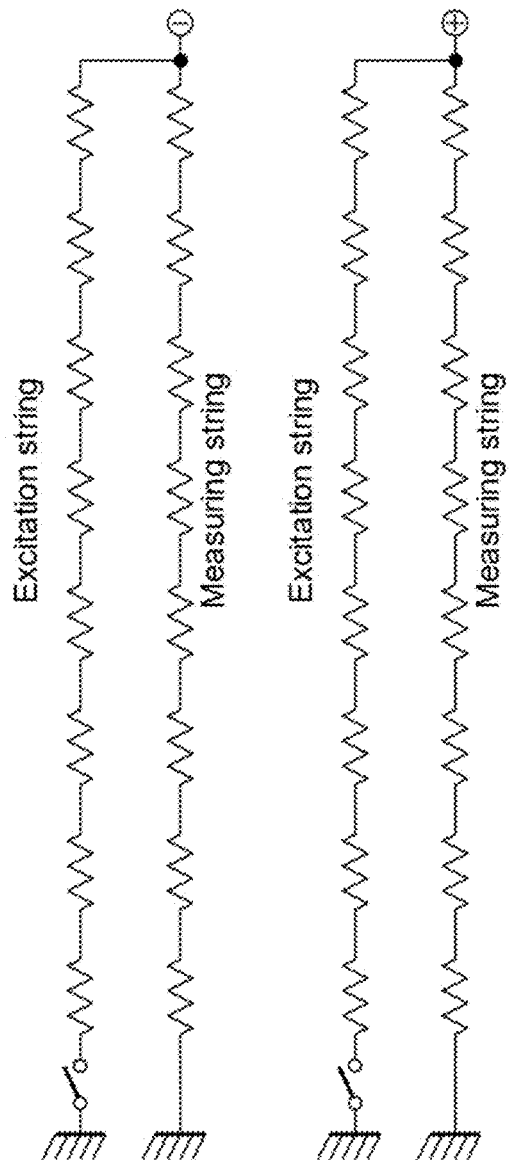
[Fig. 6]

ISOLATION MONITORING

The present application claims priority from and domestic benefit from U.S. patent application No. 63/365,251, which patent application is hereby incorporated herein by reference for all purposes.

BACKGROUND

Many electric vehicles and other devices contain high-voltage battery systems. It is important to protect against leakage of the high voltage in unintended directions, for example due to deterioration of insulation or due to other events such as mechanical failures. It is likewise important to monitor the vehicle or device with a goal of detecting deterioration of such insulation and with a goal of detecting such mechanical failures. In the event that such deterioration is detected, or in the event that such a mechanical failure is detected, it is desired to annunciate the event. This permits warning affected persons and permits the taking of remedial steps.

It will not surprise the alert reader that such so-called "isolation monitoring" is not at all easy to do if one tries simultaneously to do it well and reliably and at reasonable cost. One of the factors that makes such isolation monitoring difficult is that an electric vehicle environment is electrically noisy. Despite devotion of enormous amounts of time and effort to such isolation monitoring, only incremental progress has been made, and each of the approaches devised thus far has any of a number of drawbacks.

It will be helpful to provide some background. Consider a typical real-life monitoring opportunity, namely a two-terminal high-voltage battery that is nearby to a (conductive) chassis. The function of an isolation monitoring device is to determine the value of the isolation resistance between either of the two battery terminals and the chassis. With a typical isolation monitoring device it is desired to issue an alarm if the isolation resistance becomes lower than a predetermined value. A typical way of choosing this predetermined value is to consider the tolerance of the human body to various levels of electrical current.

With some systems having a high-voltage battery, the chassis is itself tied to an earth ground. This is observed most often for systems that are stationary. Other systems having a high-voltage battery are not stationary. A typical example of such a system is an electric vehicle ("EV"), for example an electric car. It is unrealistic to set a goal of tying the chassis of such a system to an earth ground for extended periods of time. (There will be brief times when the chassis of an EV is tied to earth ground, for example while charging is taking place.) When an electrical system is not connected to an earth ground, as is generally the case for an EV, the system is said to have a "floating" ground, sometimes called an "IT". The abbreviation IT comes from the French term "isolé terre" (isolated earth) and it is used by IEC (International Electrotechnical Commission) to describe a power system with what is defined as a "floating" ground. Such a system 300 is depicted schematically in FIG. 3. The system 300 has a high-voltage battery 301 and has first and second battery terminals 310 and 305. Importantly neither of the battery lines 310 and 305 is intentionally tied to chassis 302. Various AC motors M and generators (strictly speaking, alternators) G may be seen, none of which is intentionally tied to chassis 302. DC-auxiliary powered systems may be seen, which are not intentionally tied to chassis 302. The figure models capacitances between the terminal line 310 and chassis, and between terminal line 305 and chassis, about which more will be said presently.

In this system, the high-voltage battery, and all the car systems connected to it, are electrically isolated from (or at least are intended to be isolated from, which is one of the points of the present invention) the chassis ground. "Chassis ground" also can be considered to include the metal body of the car and various conductive car parts with which passengers frequently come into contact. The battery of an EV is connected through DC-to-AC-converters to motors M that are coupled to wheels.

The motors also serve as electrical generators G (more accurately termed, alternators) during regenerative braking, and thus are again coupled to the battery. Various other auxiliary systems of the car are DC-powered and are coupled to the battery through DC-to-DC converters. Yet another electrical connection between the high-voltage battery and chassis (or IT) can be capacitors provided for a purpose of reducing EMI (electromagnetic interference) noise. It is also the case that small parasitic capacitances exist in any electrical system and this can include small parasitic capacitances between high-voltage conductors and chassis. All of these couplings present risks or opportunities for electrical leakage or mechanical failures as described above. Any such leakage or failure would desirably be detected by an isolation monitoring system.

In a legacy internal-combustion-engine ("ICE") vehicle, it is commonplace for one of the two battery terminals to be tied to chassis. In recent decades it has been commonplace that the terminal tied to chassis is the negative terminal. Such a design choice (tying one of the battery terminals to chassis) is easy to make if the battery voltage is relatively low. For ordinary passenger cars, the battery voltage is 12 volts, for example. It is not very difficult to choose materials and form factors and dimensions to isolate a positive 12-volt line.

In contrast, when a vehicle (such as an EV) has a battery with a voltage of many hundreds of volts, the thoughtful designer will choose to avoid tying either battery terminal to chassis. This path (avoiding tying either battery terminal to chassis) serves an important purpose for the safety of a car and those in contact with it. If for example the negative of the battery were connected to the chassis, and if an isolation fault were to occur with respect to one of the positive cables, an immediate short might effectively be created at the battery terminals. This would at the very least cause fuses to blow. This could result in immediate loss of power in the electric vehicle-including loss of braking power-which could result in accidents or other problems.

We now model, theoretically, an isolation fault, in the system 300 of FIG. 3. The modeled fault is a modeled resistance 340 lying between battery line 305 and chassis. In an IT power system as shown in FIG. 3 (that is, in a system where the designer has carefully avoided intentionally tying either battery terminal to chassis), a single isolation fault 340 would not cause an immediate power failure. It also would not cause any immediate danger for the car passengers, as long as they manage to avoid touching the unaffected terminal of the battery (here, terminal 310). The EV will have been designed so that each of the battery terminals (including the unaffected battery terminal 310 in our imagined example) is shielded from passenger access. Ideally, an isolation monitoring system will detect the single isolation fault such as the fault 340 that is modeled in this figure. The driver will receive a warning, and will then be able to drive the car safely and in full capacity to a service location. In case of an accident, which may cause itself an isolation fault, the emergency first responders will have been trained to take safety precautions and to avoid touching possibly affected parts of the automobile.

A typical approach for isolation monitoring is to set up some kind of electrical excitation that is applied in an active way to the conductors involved, and then to measure the voltages at the conductors involved. If first and second particular conductors are well isolated electrically from each other, then excitation applied to a first conductor will not be appreciably detected at the second conductor, or vice versa.

One isolation monitoring approach may be seen in U.S. Pat. No. 10,852,332 issued Dec. 1, 2020 and entitled "Isolation Monitoring Device And Method".

It will be appreciated that many events can bring about an isolation fault such as is being discussed herein. One event giving rise to an isolation fault is deterioration of insulating materials resulting from extreme hot-cold cycles, or resulting from sparks, or resulting from other electrical hazards. Rodents have been observed to nibble on wiring insulation and this can give rise to isolation faults.

Many isolation monitoring approaches have been proposed, in particular for EVs. Many of the approaches are physically bulky. Some have high parts counts and thus have failure risks tied to the high parts counts. Some are very expensive to implement. Some are susceptible to electrical noise or for other reasons are at risk of yielding false positives. It will be appreciated that it would be very desirable if an approach could be found for isolation monitoring that is not as physically bulky as legacy approaches, is less expensive to implement as legacy approaches, is at least as reliable as legacy approaches, and does not have a higher rate of error than legacy approaches.

SUMMARY OF INVENTION

An isolation monitoring approach according to the invention is defined with respect to first and second battery connection positions, each of which is not tied to a chassis. First and second respective resistor strings, each having a first end and a second end, are each connected at their first end to the respective first and second battery connection positions. The first and second resistor strings are each connected at their second end to the chassis. In each of the first and second resistor strings, an optically-controlled MOSFET relay is connected across part of the resistor string. Connected to each of the resistor strings, at a point between the MOSFET relay and the chassis, is a respective voltage measurement circuit connected to measure voltage relative to the chassis. In operation, the MOSFETs associated with each of the resistor strings can be turned on and off. This brings about an excitation signal with respect to the resistor strings, and the voltage measurement circuits can measure the voltages during the time of the excitation signal, comparing them with the voltages in the absence of the excitation signal. This permits arriving at an inferred value for isolation loss along a modeled leakage path between the associated battery connection positions and the chassis. In the event of an isolation failure, the event can be annunciated.

BRIEF DESCRIPTION OF DRAWINGS

The invention will be described with respect to a drawing in several figures.

FIG. 1 shows a current-excitation approach for isolation monitoring.

FIG. 2 shows a voltage-excitation approach for isolation monitoring.

FIG. 3 shows a typical EV with a chassis ground that is understood to be "floating" relative to any earth ground, and in which neither of the high-voltage terminals is intentionally tied to the chassis.

FIG. 4 shows a resistor string according to the invention.

FIG. 5 shows two resistor strings according to the invention.

FIG. 6 shows a prior-art way of doing isolation monitoring.

DETAILED DESCRIPTION

It is helpful to be reminded how leakage resistances can be measured.

FIG. 1 shows a current-excitation approach for isolation monitoring. In FIG. 1 we have the (modeled) unknown resistance 103 lying between a battery terminal and chassis 104. We apply a known current 101. We measure voltage at 102. This permits arriving at an estimate of the resistance 103. If the resistance is too small (below some predetermined threshold) then this is defined as an isolation fault and is annunciated.

FIG. 2 shows a voltage-excitation approach for isolation monitoring. In FIG. 2 we have the (modeled) unknown resistance 204 lying between a battery terminal and chassis 205. We position a known resistance 202 as shown. We apply a known voltage 201. We measure voltage at 203. This permits arriving at an estimate of the resistance 204. If the resistance is too small (below some predetermined threshold) then this is defined as an isolation fault and is annunciated.

In each of the approaches of FIG. 1 and FIG. 2, it is typical for the excitation signal that is employed to test and monitor electrical isolation to come from somewhere other than the high-voltage battery itself. As will become clear from the discussion that follows, it is helpful to consider an isolation monitoring approach in which the high-voltage battery itself provides all or nearly all of the excitation current for isolation monitoring.

FIG. 6 shows a prior-part way of doing isolation monitoring. We see four resistor strings. Connected to a negative terminal of the high-voltage battery are two resistor strings, a first one of which is used for excitation and a second one of which is used for measuring. Connected to a positive terminal of the high-voltage battery are two resistor strings, a first one of which is used for excitation and a second one of which is used for measuring. It is appreciated that separate resistive strings are employed for the measurement and for excitation. The approach shown in FIG. 6 has the advantage of being conceptually simple.

The approach shown in FIG. 6 has, however, a number of potential disadvantages.

Component count. In a system having a 1 kV battery, it is commonplace to construct each string from ten resistors. For the approach in FIG. 6, this means that forty resistors would be required. With an appropriate clearance/creepage this consumes a lot of real estate on a printed circuit board.

Service life for switches. If an isolation monitoring device is operated with a reasonably fast response, using an approach such as in FIG. 6, the switches will operate frequently. An electromechanical relay switch might be rated for 1 million activations, but that number of operations could be reached in a mere 23 days at a 4-second cycle time.

It will also be appreciated that the maximum possible voltage stress for the switches is very high −1 kV for a 1-kV battery.

To summarize this implementation as shown in FIG. 6, there is a first resistive string for the Measurements and a second resistive string for Excitation. It is understood that the voltage stress in this implementation is larger (that is, the whole Battery voltage if the other side has leakage), and the number of parts needed for the inventive implementation is basically halved by comparison with the implementation shown in FIG. 6.

FIG. 4 shows a resistor string 403. This is one of the two resistor strings to be employed in a system using a high-voltage battery, in which both terminals of the battery are intended to "float" relative to chassis. Each of these resistor strings forms part of an overall isolation monitoring system. Importantly, as will be appreciated by the alert reader, a single resistor string is able to serve two functions-providing excitation (from the high-voltage battery itself, as just mentioned) and providing measurement. In this way the component count is likely to be cut in half compared with many legacy approaches which might require one resistor string for excitation and another resistor string for measurement. Reducing component count offers many benefits, one of which is a smaller form factor. Another potential benefit from the smaller parts count is better reliability. Still another potential benefit is reduced cost.

First end 401 of the resistor string gets connected to one of the terminals of the high-voltage battery. The other end of the resistor string at 407 gets connected to chassis. The resistor string is constructed from a plurality of individual resistors 402. There are, as mentioned earlier, two such resistor strings, one tied to a positive terminal of the high-voltage battery and the other tied to a negative terminal of the high-voltage battery. Only one of the two resistor strings is shown in FIG. 4 for clarity and simplicity of discussion.

We now draw our attention to switch 404. Switch 404 is an optically isolated switch. It might be thought that the switch could be a bipolar transistor switch, but it is considered preferable to use a MOSFET.

Point 405 is a takeoff point for voltage measurement relative to chassis.

The procedure to be followed is essentially measurement of voltage at point 405 at two times—with the switch 404 open and with it closed. Calculations can be carried out, taking into account what is known about the resistors in the string 403, to arrive at an estimate of any leakage resistance (isolation failure) located elsewhere in the monitored system between point 401 and point 407.

The alert reader will appreciate that this approach assumes that a high-voltage battery is present in the system. In this sense, the high-voltage battery is providing the excitation current.

We can now turn to a discussion of some of the additional benefits of this approach. The switch 404, for example, is exposed to voltage excursions that are not as wide as that of the entire battery voltage. For this reason the switch 404 does not need to be expensive as it would need to be if it had to deal with the full voltage of the high-voltage battery. The same may be said for the voltage measurement circuitry connected to takeoff point 405.

The circuit as set forth in FIG. 4 assumes that the takeoff point 405 is between the switch 404 and chassis. This circuit also assumes that the voltage measurement is between such a takeoff point and chassis. To generalize slightly, it is conceivable that the two points on the resistor string where the switch connects, and the two points where voltage measurement take place, could be sequenced differently than as shown in FIG. 4 without departing from the invention itself. In general, however, it is thought preferable to make all of these points be fairly nearby to chassis potential, and fairly nearby to each other in terms of resistance value in the resistor string, so as to minimize the voltage ratings required for the components involved. It is thought preferable to have the bottom resistor 406 be of a different value than that of the other resistors in the string.

U.S. Pat. No. 8,373,408 issued Feb. 12, 2013 entitled High precision algorithmically assisted voltage divider with fault detection offers helpful approaches for precise voltage measurements.

The circuit as set forth in FIG. 4 might be provided twice, once for each of two battery terminals at a high-voltage battery. The teachings communicated in FIG. 4, which include the notion of using a single resistor string for both excitation and measurement, can interestingly be applied in an even more economical way (in terms of parts count, for example) as shown in FIG. 5, as will now be discussed.

In FIG. 5 we see three operational amplifiers ("op amps") 517, 519, and 520. The op amps will preferably be rail-to-rail capable both at their inputs and at their outputs. We see a low-voltage (relative to chassis) resistor string 512, 513, 514, 515 running from a positive supply rail (for example +5V) 511 to chassis 516. We see the high-voltage battery 502 that is the motivation for all of the discussions above. We see the positive high-voltage connection point 504 and the negative high-voltage connection point 503, which as discussed above, are each kept "floating" relative to chassis except in the event of an unintended loss of isolation.

We can now identify circuit elements in FIG. 5 that are counterparts to circuit elements in FIG. 4 so far as the positive connection point of the high-voltage battery 502 is concerned. Starting at the high-voltage terminal 504, we encounter resistor string elements 505, and then resistor string element 508 that is switched by MOSFET switch 507. There is a takeoff to voltage sensing op amp 520 which is preferably configured as a unity-gain op amp, to an analog-to-digital converter (ADC) at 522. The resistor string finishes with bottom resistor 515 to chassis 516.

Similarly we can now describe circuit elements in FIG. 5 that are counterparts to circuit elements in FIG. 4 so far as the negative connection point of the high-voltage battery 502 is concerned. Starting at the high-voltage terminal 503, we encounter resistor string elements 506, and then resistor string element 510 that is switched by MOSFET switch 509. There is a takeoff to voltage sensing op amp 517 which is preferably configured as a unity-gain op amp, to an analog-to-digital converter (ADC) at 518. The resistor string finishes with bottom resistor 512 to rail 511 (and to chassis as will be discussed presently).

Op amp 519 and associated circuitry (which may be termed a "dithering circuit") provide a dithering capability that allows a slightly more sophisticated estimation of the (modeled) leakage resistance from any of the two battery terminals to chassis. A square wave enters at 521, passing through an RC network becoming a nominal triangular wave, driving the op amp 519 which is preferably configured for a gain of 5. The op amp 519 thus feeds a nominal peak-to-peak half-volt triangular wave to the node between resistors 513, 514, drawn from rail 511 and chassis 516. This will preferably give rise to about a tenth of a volt peak-to-peak of a triangular wave dither at the node between resistors 514, 515 and at the node between resistors 512, 513. This dither permits the analysis at the ADCs 522, 518 to learn a bit more about the presence and magnitude of the (possible) isolation failures that the system hopes to detect if present, as well as ascertain that the op amps 517, 519, 520 and the associated circuitry are operating normally, with the view to assuring the functional safety of the isolation monitoring apparatus.

It may be helpful to do a bit of review at this point in the discussion.

A first important aspect of the implementation of the present invention is that we are using the same resistive strings for both the measurements and the excitation. A second important aspect of the present invention is that the voltage stress for the circuit element that shorts part of the resistive string to provide the excitation—is much smaller than for the previous art.

For any measurements that are leading to the estimation of the leakage resistances (and of the capacitance in the system), two (2) measurements (one from each of the two measurement points) are required. Estimation of the leakage/capacitance is not possible if only a measurement from one point is available. If the system did not have a battery and the load (that would effectively change the voltage of the battery when energized)—then it would have been possible to deduce the leakage from just a single measurement point. However, since the battery voltage changes, and we assume it changes dynamically in an unpredictable fashion—then we also need to know the battery voltage values.

While the most fruitful use of the excitation and measurement approach being described here involves doing two measurements (one at each of two measurement points), it is possible to obtain at least a modest amount of useful information if only a single resistive string is being modulated.

The implementation shown here depicts two "switchable" strings for the following reasons:

- it provides a degree of redundancy—if switching does not work on one side, then the functionality of the device is not completely defeated, it will still work with reduced accuracy; and
- having the ability to change both resistive strings produces an effective excitation that is twice as large.

Small offsets near the chassis node. Reviewing FIG. 5, the alert reader appreciates that the excitation switches 508, 509 are not mere metallic contacts with close-to-zero voltage drops. Instead, they are semiconductor switches. In an exemplary implementation, there is a resistive string (which includes resistance 505) on the positive-sensing side, which is "terminated" at (roughly) chassis/ground plus 0.5 V.

In this exemplary implementation, there is a resistive string (which includes resistance 506) on the negative-sensing side, which is "terminated" at chassis/ground plus (roughly) 4.5 V for the negative side. We can think of the two resistive strings just mentioned, together with the battery 502, defining a "loop". The semiconductor voltage drops across the two semiconductor switches 508, 509, when combined, may be thought of as a built-in small virtual battery (with a value of, say, 4 V) being located "in the loop".

While the presence of this small virtual battery in the loop does not allow for quick or accurate estimation of the leakage and capacitance, its presence does permit at least a gross assessment of the leakage under some conditions (such as when the positive and negative battery terminals (measurement points) are shorted, and for the negative point alone, and to a lesser degree for the positive point). It will thus be appreciated by the alert reader that with the battery voltage equal to zero, and/or when the battery is completely removed, there is still an ability to provide at least a gross estimate, however slow and inaccurate it may be, of leakage and capacitance.

Having said all of this about the small virtual battery and the limited amount of leakage and capacitance information that it can provide, we can be reminded that for quick and accurate estimates of leakage and capacitance, the presence of the battery voltage (from battery 502) needs to be present.

Flexibility as to operating voltage. The actual voltage levels that this approach can work at are completely flexible. It is possible to adjust the resistance values for any required impedance and for any required maximum operating voltage. This discussion mentions the "maximum operating voltage" because some safety standards specify the maximum voltage change streaming from the excitation (there is a typical limit of +/−110V). In the implementation of this approach, the excitation voltage changes are linearly proportional to the battery voltage. Because of this, the circuit should be constructed with the view of the Maximum Battery voltage.

What this circuit can and cannot do. This implementation can, through estimating the resistive leakage and stored energy in the capacitors, arrive at an estimate for the hazard/fault current that might result if a person were to touch one of the high voltage ends of the battery (that is a part of the IT/floating system), while the same person is having a conductive path to GND. This implementation cannot predict the fault current, or warn about danger, if the person simultaneously touches both positive and negative terminals of the high voltage battery. Likewise, this implementation is not providing an estimate for the hazard currents that may flow through the leakage resistances from one pole of the battery to the other, while potentially discharging the battery and even possibly resulting in a fire or some other unpleasant heat event.

The alert reader will have no difficulty devising myriad obvious variants and improvements to the invention, all of which are intended to be encompassed within the claims that follow.

The invention claimed is:

1. An apparatus for use with respect to a chassis and with respect to first and second battery connection positions, each of which is not tied to the chassis, the apparatus comprising:
   first and second respective resistor strings, each having a first end and a second end, the first resistor string connected at its first end to the first battery connection position, the second resistor string connected at its first end to the second battery connection position, the first and second resistor strings each connected at its second end to the chassis;
   each of the first and second resistor strings further comprising a switch connected across part of the resistor string;
   the apparatus further comprising first and second voltage measurement apparatus, each of the first and second voltage measurement apparatus having first and second voltage measurement terminals, the first voltage measurement apparatus connected to the first resistor string at two non-identical points along the first resistor string, the second voltage measurement apparatus connected to the second resistor string at two non-identical points along the second resistor string.

2. The apparatus of claim 1 wherein the point at which the first voltage measurement terminal of the first voltage measurement apparatus is connected with the first resistor string is at a point between the switch and the chassis, and wherein the point at which the first voltage measurement terminal of the second voltage measurement apparatus is connected with the second resistor string is at a point between the switch and the chassis, and wherein the point at which the second voltage measurement terminals of the first and second voltage measurement apparatus are connected to the resistor strings is at the chassis.

3. The apparatus of claim 1 wherein the portion of each resistor string across which the switch is connected represents no more than fifty percent of the resistance of the resistor string.

4. The apparatus of claim 3 wherein the portion of each resistor string across which the switch is connected represents no more than forty percent of the resistance of the resistor string.

5. The apparatus of claim 1 further comprising a battery of at least 400 volts connected across the first and second battery connection positions.

6. The apparatus of claim 5 further characterized in that the battery provides excitation current for isolation monitoring at the first resistor string and at the second resistor string.

7. The apparatus of claim 5 further comprising an electric vehicle.

8. The apparatus of claim 5 wherein the battery is at least 1000 volts.

9. The apparatus of claim 7 further comprising an electric vehicle.

10. The apparatus of claim 5 further characterized in that the chassis is electrically connected to an earth ground.

11. The apparatus of claim 10 further characterized in that the apparatus is stationary.

12. The apparatus of claim 1 where each switch is an optically-controlled MOSFET relay.

13. The apparatus of claim 1 wherein the two resistor strings have some resistor elements in common between the switches and the chassis.

14. The apparatus of claim 13 wherein a dithering circuit for injecting a dithering signal is connected between the switches and the chassis.

15. A method for use with respect to a chassis and for use with respect to first and second battery connection positions, each of which is not tied to the chassis, and for use with apparatus for use with respect to the chassis and with respect to the first and second battery connection positions, the apparatus comprising first and second respective resistor strings, each having a first end and a second end, the first resistor string connected at its first end to the first battery connection position, the second resistor string connected at its first end to the second battery connection position, the first and second resistor strings each connected at its second end to the chassis; each of the first and second resistor strings further comprising a switch connected across part of the resistor string; the apparatus further comprising first and second voltage measurement apparatus, each of the first and second voltage measurement apparatus having first and second voltage measurement terminals, the first voltage measurement apparatus connected to the first resistor string at two non-identical points along the first resistor string, the second voltage measurement apparatus connected to the second resistor string at two non-identical points along the second resistor string; the method comprising the steps of:
  measuring the voltage at the first measurement apparatus with the switch of the first resistor string open;
  measuring the voltage at the first measurement apparatus with the switch of the first resistor string closed;
  measuring the voltage at the second measurement apparatus with the switch of the second resistor string open;
  measuring the voltage at the second measurement apparatus with the switch of the second resistor string closed;
  carrying out an analysis based upon the measured voltages to arrive at an estimate of any isolation failure between the first battery connection position and the chassis;
  carrying out an analysis based upon the measured voltages to arrive at an estimate of any isolation failure between the second battery connection position and the chassis; and
  annunciating to a human user in the event of an estimated isolation failure thereof.

16. The method of claim 15 wherein the measuring of the voltage at the first measurement apparatus with the switch of the first resistor string closed comes after the measuring the voltage at the first measurement apparatus with the switch of the first resistor string open, and wherein the measuring of the voltage at the second measurement apparatus with the switch of the second resistor string closed comes after the measuring the voltage at the second measurement apparatus with the switch of the second resistor string open.

17. The method of claim 15 wherein a battery is connected between the first battery connection position and the second battery connection position.

18. The method of claim 15 wherein the two resistor strings have some resistor elements in common between the switches and the chassis, and wherein a dithering signal is injected between the switches and the chassis.

19. An apparatus for use with respect to a chassis and with respect to first and second battery connection positions, each of which is not tied to the chassis, the apparatus comprising:
  a resistor string, the string having a first end and a second end, the resistor string connected at its first end to the first battery connection position, the resistor string connected at its second end to the chassis;
  the first resistor string further comprising a switch connected across part of the resistor string;
  the apparatus further comprising a voltage measurement apparatus, the voltage measurement apparatus having first and second voltage measurement terminals, the voltage measurement apparatus connected to the resistor string at two non-identical points along the resistor string.

20. The apparatus of claim 19 wherein the point at which the voltage measurement terminal of the voltage measurement apparatus is connected with the resistor string is at a point between the switch and the chassis, and wherein the point at which the second voltage measurement terminal of the voltage measurement apparatus is connected to the resistor string is at the chassis.

21. The apparatus of claim 19 wherein the portion of the resistor string across which the switch is connected represents no more than fifty percent of the resistance of the resistor string.

22. The apparatus of claim 21 wherein the portion of the resistor string across which the switch is connected represents no more than forty percent of the resistance of the resistor string.

23. The apparatus of claim 19 further comprising a battery of at least 400 volts connected across the first and second battery connection positions.

24. The apparatus of claim 23 further characterized in that the battery provides excitation current for isolation monitoring at the resistor string.

25. The apparatus of claim 23 further comprising an electric vehicle.

26. The apparatus of claim 23 wherein the battery is at least 1000 volts.

27. The apparatus of claim 26 further comprising an electric vehicle.

28. The apparatus of claim 23 further characterized in that the chassis is electrically connected to an earth ground.

29. The apparatus of claim 28 further characterized in that the apparatus is stationary.

30. The apparatus of claim 19 where the switch is an optically-controlled MOSFET relay.

31. The apparatus of claim 30 wherein a dithering circuit for injecting a dithering signal is connected between the switch and the chassis.

32. A method for use with respect to a chassis and for use with respect to first and second battery connection positions, each of which is not tied to the chassis, and for use with apparatus for use with respect to the chassis and with respect to the first and second battery connection positions, the apparatus comprising a resistor string, the string having a first end and a second end, the resistor string connected at its first end to the first battery connection position, the resistor string connected at its second end to the chassis; the resistor string further comprising a switch connected across part of the resistor string; the apparatus further comprising a voltage measurement apparatus, the voltage measurement apparatus having first and second voltage measurement terminals, the voltage measurement apparatus connected to the resistor string at two non-identical points of the resistor string; the method comprising the steps of:

measuring the voltage at the measurement apparatus with the switch of the resistor string open;

measuring the voltage at the measurement apparatus with the switch of the resistor string closed;

carrying out an analysis based upon the measured voltages to arrive at an estimate of any isolation failure between the first battery connection position and the chassis; and annunciating to a human user in the event of an estimated isolation failure thereof.

33. The method of claim 32 wherein the measuring of the voltage at the first measurement apparatus with the switch of the first resistor string closed comes after the measuring the voltage at the first measurement apparatus with the switch of the first resistor string open.

34. The method of claim 32 wherein a battery is connected between the first battery connection position and the second battery connection position.

35. The method of claim 32 wherein a dithering signal is injected between the switch and the chassis.

* * * * *